(12) United States Patent
Spath et al.

(10) Patent No.: US 11,824,143 B2
(45) Date of Patent: Nov. 21, 2023

(54) OPTOELECTRONIC COMPONENT, METHOD FOR PRODUCING AN OPTOELECTRONIC COMPONENT AND LIGHTING DEVICE

(71) Applicant: OSRAM Opto Semiconductors GmbH, Regensburg (DE)

(72) Inventors: Günter Spath, Puchheim (DE); Daniel Leisen, Regensburg (DE); Simon Jerebic, Donaustauf (DE); Matthias Kiessling, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 437 days.

(21) Appl. No.: 17/285,905

(22) PCT Filed: Oct. 14, 2019

(86) PCT No.: PCT/EP2019/077762
§ 371 (c)(1),
(2) Date: Apr. 15, 2021

(87) PCT Pub. No.: WO2020/083692
PCT Pub. Date: Apr. 30, 2020

(65) Prior Publication Data
US 2021/0376199 A1    Dec. 2, 2021

(30) Foreign Application Priority Data
Oct. 24, 2018   (DE) .......................... 102018126494.1

(51) Int. Cl.
*H01L 33/50*  (2010.01)
*H01L 33/56*  (2010.01)

(52) U.S. Cl.
CPC ............. *H01L 33/502* (2013.01); *H01L 33/56* (2013.01); *H01L 2933/005* (2013.01); *H01L 2933/0041* (2013.01); *H01L 2933/0091* (2013.01)

(58) Field of Classification Search
CPC ....... H01L 33/44–465; H01L 33/52–56; H01L 2933/0025; H01L 2933/005
See application file for complete search history.

(56) References Cited

U.S. PATENT DOCUMENTS 9,164,354 B2   10/2015  Ahlstedt et al.
9,312,435 B2    4/2016  Gärtner et al.

FOREIGN PATENT DOCUMENTS

DE   102010048162 A1   4/2012
DE   102010055265 A1   6/2012

(Continued)

*Primary Examiner* — Daniel P Shook
(74) *Attorney, Agent, or Firm* — Slater Matsil, LLP

(57) ABSTRACT

In an embodiment an optoelectronic component includes a radiation emitting semiconductor chip configured to emit primary electromagnetic radiation from a radiation emission surface, a conversion element configured to convert the primary electromagnetic radiation into electromagnetic secondary radiation, a first potting covering at least one side surface of the semiconductor chip, a second potting arranged on the first potting and an adhesion promoter with which the conversion element is fixed on the radiation emission surface of the semiconductor chip, wherein the adhesion promoter is arranged on a top surface of the first potting, wherein the first potting includes first filler particles, wherein the second potting includes second filler particles, and wherein a mass fraction of the first filler particles is greater than a mass fraction of the second filler particles per volume element.

17 Claims, 2 Drawing Sheets

(56) References Cited

FOREIGN PATENT DOCUMENTS

| | | | |
|---|---|---|---|
| DE | 102011118290 A1 | 5/2013 | |
| EP | 3098861 A1 | 11/2016 | |
| JP | 2013175759 A * | 9/2013 | ............. H01L 24/92 |
| JP | 2013175759 A | 9/2013 | |

* cited by examiner

OPTOELECTRONIC COMPONENT, METHOD FOR PRODUCING AN OPTOELECTRONIC COMPONENT AND LIGHTING DEVICE

This patent application is a national phase filing under section 371 of PCT/EP2019/077762, filed Oct. 14, 2019, which claims the priority of German patent application 102018126494.1, filed Oct. 24, 2018, each of which is incorporated herein by reference in its entirety.

TECHNICAL FIELD

An optoelectronic component is specified. In addition, a method for producing an optoelectronic component and a lighting device are disclosed.

SUMMARY

Embodiments provide an optoelectronic component having an increased efficiency. Further embodiments provide a method for producing such an optoelectronic component and a lighting device comprising such an optoelectronic component.

According to at least one embodiment, the optoelectronic component comprises a radiation emitting semiconductor chip, which emits primary electromagnetic radiation from a radiation emission surface during operation. Preferably, a top surface of the semiconductor chip forms the radiation emitting surface. Alternatively, it is possible that an edge region of the top surface of the semiconductor chip is not part of the radiation emitting surface. The primary electromagnetic radiation emitted by the radiation emitting semiconductor chip can be, for example, near ultraviolet radiation, visible light and/or near infrared radiation. Preferably, the primary electromagnetic radiation emitted is blue light.

Preferably, the optoelectronic component has a main extension plane. A vertical direction extends perpendicular to the main extension plane and a lateral direction extends parallel to the main extension plane.

Preferably, the radiation emitting semiconductor chip is a surface emitter in which most, for example at least 80%, of the emitted primary radiation exits via the radiation emitting surface comprised by the top surface of the radiation emitting semiconductor chip.

The surface emitter can be, for example, a thin layer chip. Thin layer chips typically have an epitaxially grown semiconductor layer sequence with an active region that generates the primary radiation during operation. The semiconductor layer sequence is preferably deposited on a different carrier element than the growth substrate for the semiconductor layer sequence. Particularly preferably, a mirror layer is arranged between the semiconductor layer sequence and the carrier element, which directs primary radiation of the active region to the radiation emitting surface. Thin layer chips generally do not emit the primary electromagnetic radiation generated in the active region during operation via side surfaces of the carrier element, but have an essentially Lambertian radiation pattern. For example, the thin layer chip has an electrical contact on the top surface of the semiconductor chip. The electrical contact can be electrically contacted by means of a bonding wire.

Alternatively, the radiation emitting semiconductor chip is a volume emitting semiconductor chip, which emits the emitted primary radiation not only over at least parts of the top surface but also over at least one side surface. For example, in a volume-emitting semiconductor chip, at least 30% of the radiated power of the emitted primary radiation exits through the at least one side surface.

The volume-emitting semiconductor chip preferably has a substrate on whose first main surface a semiconductor layer sequence with an active region is usually epitaxially grown. In operation, the active region generates primary electromagnetic radiation. For example, the substrate can comprise or consist of any of the following materials: sapphire, silicon carbide, glass.

For example, the volume emitting semiconductor chip can be a flip chip. In this case, two electrical contacts are generally arranged on a second main surface of the substrate of the flip chip opposite the top surface of the semiconductor chip, which contacts are provided for electrically contacting the semiconductor chip. The two electrical contacts are preferably arranged spaced apart from one another in the lateral direction.

The electrical contacts preferably comprise or consist of a metal. The metal preferably comprises one of the following materials: copper, gold, platinum, titanium.

Alternatively, an electrical contact of the volume emitting semiconductor chip can be arranged on the top surface of the semiconductor chip. In this case, the electrical contact can be electrically contacted, for example, by means of a bonding wire.

The semiconductor layer sequence is, for example, an epitaxially grown semiconductor layer sequence forming a semiconductor body. The semiconductor body can be based on or consist of a III-V compound semiconductor material. The III-V compound semiconductor material can be a nitride compound semiconductor material. Nitride compound semiconductor materials are compound semiconductor materials containing nitrogen, such as the materials from the system $In_xAl_yGa_{1-x-y}N$ with $0 \leq x \leq 1$, $0 \leq y \leq 1$ and $x+y \leq 1$. In particular, epitaxially grown semiconductor bodies with active regions based on a nitride compound semiconductor material are generally suitable for generating light from the ultraviolet to blue spectral range as primary electromagnetic radiation. In addition, semiconductor bodies based on a nitride compound semiconductor material can be epitaxially grown on a substrate comprising sapphire or silicon carbide. These materials are generally transparent to blue or ultraviolet primary radiation generated in the active region.

Furthermore, the radiation emitting semiconductor chip is preferably surface mountable. Preferably, the optoelectronic component comprises a carrier, on which the radiation emitting semiconductor chip is arranged. The carrier is formed or comprises, for example, a metallic and/or ceramic material. The carrier is or comprises, for example, a circuit board or a lead frame.

According to at least one embodiment, the optoelectronic component comprises a conversion element that converts primary radiation into secondary electromagnetic radiation. Preferably, the conversion element converts electromagnetic primary radiation into electromagnetic secondary radiation of a different wavelength range. Particularly preferably, the secondary radiation comprises longer wavelengths than the primary radiation.

According to at least one embodiment, the optoelectronic component comprises a first potting covering at least one side surface of the semiconductor chip. The first potting preferably embeds the semiconductor chip. The top surface of the semiconductor chip is preferably free of the first potting. The first potting is preferably in direct contact with the side surface of the semiconductor chip. The first potting can have a thickness equal to a thickness of the radiation emitting semiconductor chip. In this case, the first potting preferably terminates flush with the top surface of the semiconductor chip. Alternatively, it is possible that the thickness of the first potting is larger or smaller than the thickness of the semiconductor chip. Furthermore, it is possible that the thickness of the first potting is not constant. For example, the thickness of the first potting can decrease away from the semiconductor chip.

For example, the first potting comprises a first matrix material. For example, the first matrix material can be a resin such as an epoxy or a silicone or a mixture of these materials. Preferably, first reflective filler particles are introduced into the first potting material.

For example, if the radiation emitting semiconductor chip has an electrical contact on the top surface of the semiconductor chip which is electrically contacted by means of a bonding wire, the first potting preferably also covers the electrical contact. In this case, the first potting protrudes above the top surface of the semiconductor chip in the vertical direction in the region of the electrical contact on the top surface of the semiconductor chip. Furthermore, it is possible that the bonding wire is partially covered by the first potting.

Alternatively, it is possible that the first potting only covers the electrical contact or another absorbing surface arranged in an edge region of the top surface of the semiconductor chip. In this case, only the edge region of the top surface of the semiconductor chip is covered by the first potting material.

In this case, the adjacent side surface of the semiconductor chip can be free of the first potting in a region adjacent to the edge region. Further, the first potting can cover the side surface of the conversion element in the edge region. Further, it is possible that the first potting in the edge region completely covers the side surface of the conversion element.

According to at least one embodiment, the optoelectronic component comprises an adhesion promoter, with which the conversion element is fixed to the radiation emitting surface of the semiconductor chip. The adhesion promoter is preferably arranged between the conversion element and the radiation emitting semiconductor chip. The adhesion promoter provides a connection between the conversion element and the radiation emitting semiconductor chip. This connection preferably fixes the conversion element to the radiation emitting semiconductor chip in a mechanically stable manner. Furthermore, the bonding is preferably thermally conductive.

The adhesion promoter preferably comprises or consists of a radiation transmissive material. Particularly preferably, the material of the adhesion promoter is configured to transmit primary electromagnetic radiation and/or secondary electromagnetic radiation. Particularly preferably, the adhesion promoter transmits at least 90% of the primary electromagnetic radiation and/or secondary electromagnetic radiation.

Preferably, the adhesion promoter comprises a resin, such as an epoxy or a silicone.

Preferably, the adhesion promoter has a transmissivity of at least 90% for primary electromagnetic radiation or secondary electromagnetic radiation.

According to at least one embodiment, the adhesion promoter is arranged on a top surface of the first potting material. The adhesion promoter is preferably in direct contact with the first potting. If the first potting terminates flush with the top surface of the semiconductor chip, the side surface of the semiconductor chip is preferably free of the adhesion promoter. If the thickness of the first potting is greater than the thickness of the semiconductor chip, the side surface of the semiconductor chip is also preferably free of the adhesion promoter. If the thickness of the first potting is smaller than the thickness of the semiconductor chip, the side surface of the semiconductor chip is preferably covered for the most part by the first potting. That is to say that the adhesion promoter arranged on the top surface of the first potting material preferably covers only a small portion of the side surface of the semiconductor chip. In this case, the adhesion promoter preferably covers at most 10% of the side surface of the semiconductor chip.

If the electrical contact at the top surface of the radiation emitting semiconductor chip is covered with the first potting, the adhesion promoter preferably partially covers the first potting in the region of the electrical contact. In this case, the first potting is preferably arranged between the electrical contact and the adhesion promoter.

According to one embodiment, the optoelectronic component comprises a radiation emitting semiconductor chip, which emits electromagnetic primary radiation from a radiation emitting surface during operation, a conversion element which converts primary radiation into electromagnetic secondary radiation, a first potting which covers at least one side surface of the semiconductor chip, and an adhesion promoter with which the conversion element is fixed on the radiation emitting surface of the semiconductor chip, the adhesion promoter being arranged on a top surface of the first potting.

An idea of the optoelectronic component described herein is, inter alia, to surround the semiconductor chip with the first potting so that the side surface of the semiconductor chip is covered with the first potting to a large extent. The adhesion promoter that fixes the conversion element to the radiation emitting semiconductor chip is usually a good light guide for the emitted primary radiation and the secondary radiation. By using the first potting, excess material of the adhesion promoter preferably does not get onto the side surfaces of the semiconductor chip.

Advantageously, a light conduction of the adhesion promoter of emitted primary radiation and secondary radiation via the side surfaces of the semiconductor chip, for example, to the carrier, is thus advantageously suppressed. Thus, the light extraction and the efficiency of the optoelectronic component are advantageously improved.

If the semiconductor chip has an electrical contact on the top surface, the first potting is advantageously arranged between the adhesion promoter and the electrical contact. Thus, a direct light conduction of primary radiation and/or secondary radiation through the adhesion promoter to the electrical contact is advantageously suppressed. Primary radiation and/or secondary radiation are thus not absorbed by the electrical contact, but reflected by the first potting. In this way, an increased light extraction and efficiency can be achieved.

According to at least one embodiment, a second potting is arranged on the first potting. The second potting comprises, for example, a second matrix material into which second reflective filler particles are introduced. The second matrix material can be a resin, such as an epoxy or a silicone, or a mixture of these materials.

Preferably, the first matrix material and the second matrix material are formed with the same materials. Furthermore, the first reflective filler particles and the second reflective filler particles preferably comprise the same material.

For example, if the radiation emitting semiconductor chip has an electrical contact on the top surface of the semiconductor chip which is electrically contacted by means of a bonding wire, the second potting can cover the portion of the bonding wire not covered by the first potting. The bonding wire is then completely covered by the first potting and the second potting. Thus, the bonding wire is advantageously no longer visible to an external observer.

According to at least one embodiment, the second potting covers at least one side surface of the conversion element. The second potting preferably embeds the conversion element in lateral direction. The top surface of the conversion element is preferably free of the second potting. The second potting is preferably in direct contact with the side surface of the conversion element.

Advantageously, by means of the second potting, the electromagnetic primary radiation and/or secondary radiation, which for example are emitted from the side surfaces of the conversion element, is reflected again and enters the conversion element once more. There, the remaining primary radiation can be converted again. Furthermore, the primary radiation and/or the secondary radiation is preferably directed towards the top surface of the conversion element by means of the second potting. This advantageously increases the light extraction of the optoelectronic component.

According to at least one embodiment, the first potting completely covers the at least one side surface of the semiconductor chip. In this case, the thickness of the first potting in the region of the side surface of the semiconductor chip is equal to or greater than the thickness of the semiconductor chip. According to this arrangement, the side surface of the semiconductor chip is preferably free of the adhesion promoter.

According to at least one embodiment, the adhesion promoter covers the top surface of the first potting and the side surface of the conversion element in places. The side surface of the conversion element is preferably covered in vertical direction up to a height by the adhesion promoter. The height up to which the adhesion promoter covers the side surface of the conversion element is preferably smaller than a height of the conversion element. The height of the conversion element is the maximum extension of the conversion element in the vertical direction.

Preferably, the side surface of the conversion element is at most 80% covered with the adhesion promoter. Particularly preferably, the side surface of the conversion element is at most 50% covered with the adhesion promoter, and in particular preferably at most 10% covered.

The top surface of the first potting material is preferably covered with the adhesion promoter in a region around the conversion element. If a ratio of an area of the top surface of the first potting to an area of the top surface of the semiconductor chip is comparatively large, a major portion of the top surface of the first potting is preferably free of the adhesion promoter. In this case, the adhesion promoter preferably covers at most 5% of the top surface of the first potting.

The adhesion promoter is preferably in direct contact with the side surface of the conversion element and the top surface of the first potting. The direct contact of the adhesion promoter to the side surfaces of the conversion element and the top surface of the first potting improves the adhesion between the conversion element and the radiation emitting semiconductor chip. The bond between the radiation emitting semiconductor chip and the conversion element is thus particularly mechanically stable.

According to at least one embodiment, an outer surface of the adhesion promoter has a convex, concave or triangular shape in cross-section. The outer surface of the adhesion promoter is the outer surface of the adhesion promoter facing away from the conversion element and the first potting. Alternatively, the outer surface of the adhesion promoter may have a free shape in cross-section perpendicular to the lateral direction.

For example, the adhesion promoter completely surrounds the side surfaces of the conversion element. For example, the adhesion promoter surrounds the conversion element in a closed shape, for example annular-shaped or frame-shaped. Here, the adhesion promoter is preferably in direct contact with the top surface of the first potting. Between the semiconductor chip and the conversion element, the adhesion promoter preferably forms a thin layer. On the side surfaces of the conversion element, for example, the adhesion promoter forms an outer surface which has a convex or concave shape in cross-section. This is usually the case when the adhesion promoter poorly wets the top surface of the first potting material.

According to at least one embodiment, the adhesion promoter is formed as a thin layer. In this case, the adhesion promoter covers a large part of the top surface of the first potting material. Furthermore, it is possible that the top surface of the first potting material is completely covered by the thin layer of the adhesion promoter. The adhesion promoter typically forms a thin layer on the top surface of the first potting material when the adhesion promoter wets the top surface of the first potting material well.

Preferably, the thin layer has a thickness of at most 5 micrometres. Particularly preferably, the thin layer has a thickness of at most 1 micrometre. Furthermore, the thickness of the thin layer preferably tapers away from the conversion element.

A cross-section of the thin layer perpendicular to the lateral direction is thus predetermined such that light conduction of primary radiation and/or secondary radiation is advantageously suppressed.

According to at least one embodiment, the first potting comprises first filler particles, which are diffusely reflective of primary radiation and/or secondary radiation emitted by the semiconductor. Preferably, the first filler particles comprise first reflective filler particles. Furthermore, the first filler particles preferably have a reflectivity of at least 90% for the primary electromagnetic radiation and/or secondary electromagnetic radiation emitted by the radiation emitting semiconductor chip.

According to at least one embodiment, the second potting comprises second filler particles, which are diffusely reflective of primary radiation and/or secondary radiation emitted by the semiconductor chip. The second filler particles preferably comprise second reflective filler particles. Furthermore, the second potting preferably has a reflectivity of at least 60% for the primary electromagnetic radiation and/or secondary electromagnetic radiation emitted by the radiation emitting semiconductor chip. Particularly preferably, the second potting has a reflectivity of at least 90% for primary radiation and/or electromagnetic secondary radiation.

Alternatively, the second potting does not comprise second filler particles and is transparent to primary electromagnetic radiation and/or secondary electromagnetic radiation emitted by the radiation emitting semiconductor chip.

According to at least one embodiment, the first filler particles and/or the second filler particles comprise $TiO_2$ particles. Alternatively, the first filler particles and/or the second filler particles can be formed of, or comprise, inter alia, $ZnO_2$ or $ZrO_2$. Preferably, the first filler particles and the second filler particles are formed by the same material.

According to at least one embodiment, a mass fraction of the first filler particles is different from a mass fraction of the second filler particles. Preferably, the mass fraction of the first filler particles is greater than the mass fraction of the second filler particles. For example, the mass fraction of the first filler particles is at least 25% by weight and at most 50% by weight and the mass fraction of the second filler particles is at least 0% by weight and at most 30% by weight. That is to say that the second potting can comprise, for example, no second filler particles. In this case, the second potting is formed only by the second matrix material. Preferably, the second matrix material is formed to be transparent to primary electromagnetic radiation or secondary electromagnetic radiation. Preferably, the second matrix material has a transmissivity of at least 90% for primary electromagnetic radiation or secondary electromagnetic radiation. Advantageously, the second matrix material provides a protection for the first potting and the conversion element.

According to at least one embodiment, the first potting has a higher reflectivity for primary radiation and/or secondary radiation than the second potting. Preferably, the first potting has a reflectivity of at least 90% for primary electromagnetic radiation and/or secondary electromagnetic radiation emitted by the radiation emitting semiconductor chip. In this case, the second potting preferably has a reflectivity for primary radiation and/or secondary radiation of at least 60%.

Preferably, the reflectivity for primary radiation and/or secondary radiation of the first potting is increased by at least 10% compared to the second potting. Particularly preferably, the reflectivity for primary radiation and/or secondary radiation from the first potting is increased by 30% compared to the second potting. Furthermore, it is possible that the reflectivity for primary radiation and/or secondary radiation from the first potting is increased by at least 95% compared to the second potting.

Advantageously, electromagnetic primary radiation and/or electromagnetic secondary radiation can be directed towards the top surface of the conversion element by the difference in reflectivity of the first potting and the second potting.

According to at least one embodiment, the conversion element comprises a ceramic material. In this case, the conversion element is a ceramic conversion element preferably comprising a ceramic layer.

For example, the conversion element comprises a third matrix material in which phosphor particles are incorporated. The third matrix material can be, for example, a resin such as an epoxy, a silicone or a mixture of these materials. Preferably, the phosphor particles impart the wavelength-converting properties to the conversion element.

For example, one of the following materials is suitable for the phosphor particles: rare earth-doped garnets, rare earth-doped alkaline earth sulphides, rare earth-doped thiogallates, rare earth-doped aluminates, rare earth-doped silicates, rare earth-doped orthosilicates, rare earth doped chlorosilicates, rare earth doped alkaline earth silicon nitrides, rare earth doped oxynitrides, rare earth doped aluminium oxynitrides, rare earth doped silicon nitrides, rare earth doped sialons.

For example, the phosphor particles comprise a first group of phosphor particles and a second group of phosphor particles. The first group of phosphor particles is preferably configured to convert primary electromagnetic radiation into first secondary electromagnetic radiation. The second group of phosphor particles is preferably configured to convert the primary electromagnetic radiation into second secondary electromagnetic radiation, which is preferably different from the first secondary radiation. The first secondary radiation is, for example, yellow to green light and the second secondary radiation is, for example, red light. In operation of the radiation emitting component, the primary radiation, the first secondary radiation and the second secondary radiation preferably mix to form warm white mixed light.

Alternatively, the phosphor particles comprise only the first group of phosphor particles. During operation of the radiation emitting component, the primary radiation and the first secondary radiation preferably mix to form cold-white mixed light.

Particularly preferably, the ceramic layer comprises a first ceramic layer and a second ceramic layer. The first ceramic layer preferably comprises a first phosphor and the second ceramic layer preferably comprises a second phosphor. The first and second phosphors comprise, for example, one of the phosphor particle materials listed above. The first ceramic layer and the second ceramic layer are preferably configured to convert primary radiation into first secondary radiation and second secondary radiation, respectively.

Alternatively, the ceramic conversion element comprises only the first ceramic layer and is configured to convert primary radiation into first secondary radiation.

Particularly preferably, the entire ceramic conversion element is formed entirely of ceramic materials. Furthermore, the ceramic conversion element is preferably a monolithic conversion element, i.e. the first ceramic layer and the second ceramic layer of the conversion element are preferably joined to one another in a materially and mechanically stable manner without a joining layer. Advantageously, a simplified handling is thus achieved, for example, compared to the use of individual conversion elements each with a different luminescent material.

According to at least one embodiment, the adhesion promoter is an adhesive.

Furthermore, a method for producing an optoelectronic component is specified, with which an optoelectronic component described herein can be produced. All features and embodiments disclosed in connection with the optoelectronic component are therefore also applicable in connection with the method, and vice versa.

According to at least one embodiment of the method, a radiation emitting semiconductor chip is provided which emits primary electromagnetic radiation from a radiation emitting surface during operation.

According to at least one embodiment of the method, a first potting is applied to cover at least one side surface of the semiconductor chip. Preferably, a material of the first potting material is preferably in a flowable form when applied. For example, the material of the first potting comprises an initially liquid resin, such as an epoxy or a silicone, into which first reflective filler particles are introduced. In this case, the material of the first potting is typically cured after being applied to form the first potting.

According to at least one embodiment of the method, a conversion element is provided which converts primary radiation into secondary electromagnetic radiation.

According to at least one embodiment of the method, a material of the adhesion promoter is applied to the radiation emitting surface of the semiconductor chip. Preferably, the material of the adhesion promoter is in a flowable form when applied. For example, the material of the adhesion promoter is applied to the radiation emitting surface of the semiconductor chip in the form of a droplet.

According to at least one embodiment of the method, the conversion element is applied to the material of the adhesion promoter, wherein the material of the adhesion promoter is partially displaced by the conversion element and arranged on a top surface of the first potting. The conversion element is, for example, centrally immersed with a bottom surface in the material of the adhesion promoter and is preferably pressed with a pressure against the radiation emitting semiconductor chip. The pressure is preferably kept constant. The material of the adhesion promoter is partially displaced by the pressure from the radiation emitting surface of the radiation emitting semiconductor chip. In other words, preferably enough material of the adhesion promoter is applied so that when the conversion element is applied to the radiation emitting surface, the material of the adhesion promoter flows from the volume of the conversion element onto the top surface of the first potting.

According to at least one embodiment of the method, the material of the adhesion promoter is applied in a flowable form and subsequently cured to form the adhesion promoter. For example, the material of the adhesion promoter can be a UV-curable material. The advantage of using UV-curable materials over a thermally-curable material is that there is no reduction in the viscosity of the material of the adhesion promoter due to the effect of temperature when the material of the adhesion promoter is cured. UV-curable materials generally polymerise fully or partially at room temperature or slightly elevated temperatures.

According to at least one embodiment of the method, the material of the adhesion promoter wets the top surface of the first potting material in places. In this case, the material of the adhesion promoter is preferably displaced in the region around the conversion element onto the top surface of the first potting material. The material of the adhesion promoter in this case preferably exhibits a cohesive force which is greater than an adhesive force of the material of the adhesion promoter with respect to the top surface of the first potting.

According to at least one embodiment of the method, the material of the adhesion promoter completely wets the top surface of the first potting material. In this case, the material of the adhesion promoter preferably has a cohesive force that is smaller than an adhesive force of the material of the adhesion promoter with respect to the top surface of the first potting material. In this case, the material of the adhesion promoter is preferably completely distributed over the top surface of the first potting material.

The two possibilities described above, according to which the top surface of the first potting material is covered in places or completely by the material of the adhesion promoter, can preferably be predetermined by a surface condition of the first potting material.

To allow the displaced material of the adhesion promoter to spread over the entire top surface of the first potting material, the top surface of the first potting material is preferably subjected to a plasma treatment. The top surface of the first potting thus has surface properties that comparatively increase the wettability with the adhesion promoter.

If the top surface of the first potting material is not subjected to the plasma treatment after application and curing, the top surface of the first potting material generally has surface properties that comparatively reduce the wettability with the adhesion promoter. By reducing the wettability, the material of the adhesion promoter is only displaced in the region around the conversion element onto the top surface of the first potting and onto the side surface of the conversion element.

Alternatively or in addition to a plasma treatment, the surface condition of the first potting material with respect to a roughness and/or a viscosity of the material of the adhesion promoter can determine whether the top surface of the first potting material is partially or completely covered by the material of the adhesion promoter.

For example, if the top surface of the first potting is comparatively smooth and the viscosity of the material of the adhesion promoter is comparatively low, the displaced material of the adhesion promoter can spread over the entire top surface of the first potting.

For example, if the top surface of the first potting is comparatively rough and the viscosity of the material of the adhesion promoter is comparatively high, the material of the adhesion promoter is only displaced in the region around the conversion element onto the top surface of the first potting. Furthermore, in this case, by means of a relation of the volume of the material of the adhesion promoter to the volume of the conversion element, a shape of an outer surface of the material of the adhesion promoter or a shape of an outer surface of the adhesion promoter can be predetermined.

Furthermore, a lighting device having an optoelectronic component is disclosed. The optoelectronic component is in particular the optoelectronic component described herein. That is to say that all features and embodiments disclosed in connection with the optoelectronic component described herein are also disclosed in connection with the lighting device described herein, and vice versa.

According to at least one embodiment, the lighting device is in the form of a headlamp.

BRIEF DESCRIPTION OF THE DRAWINGS

In the following, the optoelectronic component, the method for producing the electronic component and the lighting device are explained in more detail with reference to the Figures by means of exemplary embodiments.

DETAILED DESCRIPTION OF ILLUSTRATIVE EMBODIMENTS

Identical, similar or similar-acting elements are provided with the same reference signs in the Figures. The figure and size ratios of the elements shown in the Figures are not to be regarded as to scale. Rather, individual elements can be shown exaggeratedly large for better representability and/or for better comprehensibility.

Figure 1:
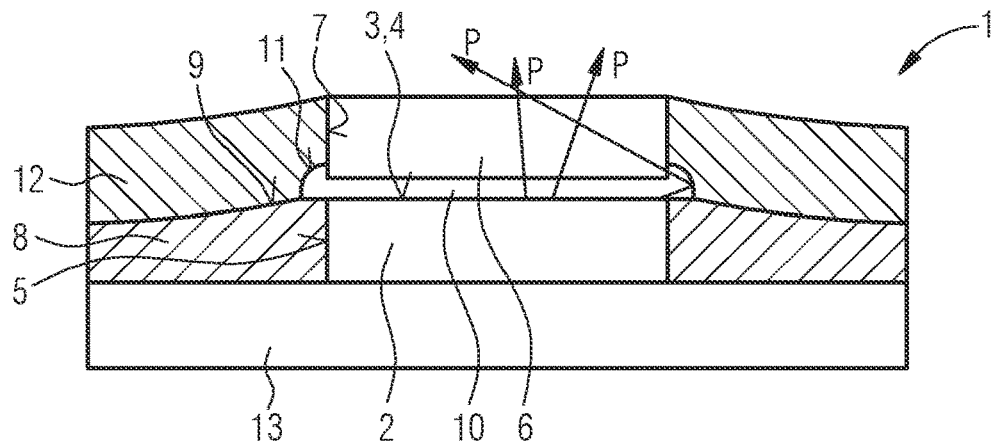
FIG. 1 shows a schematic sectional view of an optoelectronic component according to an exemplary embodiment.

The optoelectronic component 1 according to the exemplary embodiment of FIG. 1 comprises a radiation emitting semiconductor chip 2 which is surrounded by a first potting 8. The semiconductor chip 2 is configured to emit electromagnetic primary radiation P from a radiation emission surface 3 during operation. A top surface of the semiconductor chip 4 here comprises the radiation emission surface 3.

The semiconductor chip 2 is a surface emitter in which the majority of the emitted primary radiation P, for example at least 80% of a radiation power, is emitted via the radiation emitting surface 3.

The first potting 8 embeds the semiconductor chip and the top surface of the semiconductor chip 4 is free of the first potting 8. The first potting 8 is in direct contact with the side surface of the semiconductor chip 5. Furthermore, first reflective filler particles are introduced into the first potting 8, which are configured to reflect primary radiation and/or secondary radiation.

The first potting 8 and the radiation emitting semiconductor chip 2 are arranged on a carrier 13. The first potting 8 has a thickness equal to a thickness of the radiation emitting semiconductor chip 2. Thus, the first potting 8 terminates flush with the top surface of the semiconductor chip 4 and the radiation emitting surface 3. Further, the thickness of the first potting 8 decreases away from the semiconductor chip 2.

A conversion element is arranged on the radiation emitting semiconductor chip 2 to convert primary electromagnetic radiation into secondary electromagnetic radiation. The electromagnetic secondary radiation comprises longer wavelengths than the electromagnetic primary radiation.

The conversion element 6 is fixed to the radiation emitting surface 3 of the semiconductor chip 2 by means of an adhesion promoter 10. The adhesion promoter 10 is arranged between the conversion element 6 and the radiation emitting semiconductor chip 2. Further, the adhesion promoter 10 surrounds the conversion element 6 in a closed form.

Between the semiconductor chip 2 and the conversion element 6, the adhesion promoter 10 preferably forms a thin layer and provides a mechanically stable connection. In the present case, the thin layer between the conversion element 6 and the radiation emitting semiconductor chip 2 has a thickness of at most 5 micrometres.

The adhesion promoter 10 is further arranged on a top surface of the first potting 9 in a region around the conversion element 6 and on at least one side surface of the conversion element 7. The side surface of the conversion element 7 is preferably covered in the vertical direction only up to a height by the adhesion promoter 10. In this case, the adhesion promoter 10 is in direct contact with the top surface of the first potting 9 and the side surface of the conversion element 7.

An outer surface of the adhesion promoter 11 facing away from the conversion element 6 and the first potting 8 has a convex shape in cross-section perpendicular to the lateral direction.

Furthermore, a second potting 12 is arranged on the first potting 8. The second potting 12 covers at least one side surface of the conversion element 7. The second potting 12 embeds the conversion element 6 such that a top surface of the conversion element is here completely free of the second potting 12. Furthermore, second reflective filler particles are introduced into the first potting 12, which are configured to reflect primary radiation and/or secondary radiation.

A mass fraction of the first filler particles is different from a mass fraction of the second filler particles in the exemplary embodiment of FIG. 1. The mass fraction of the first filler particles is greater than the mass fraction of the second filler particles. For example, the mass fraction of the first filler particles is at least 25% by weight and at most 50% by weight and the mass fraction of the second filler particles is at least 0% by weight and at most 30% by weight.

Advantageously, the primary electromagnetic radiation P, which is coupled into the adhesion promoter 10 and does not directly enter the conversion element 6, is reflected at the outer surface of the adhesion promoter 11 by means of the second potting 12 and is directed towards the conversion element 6.

Figure 2:
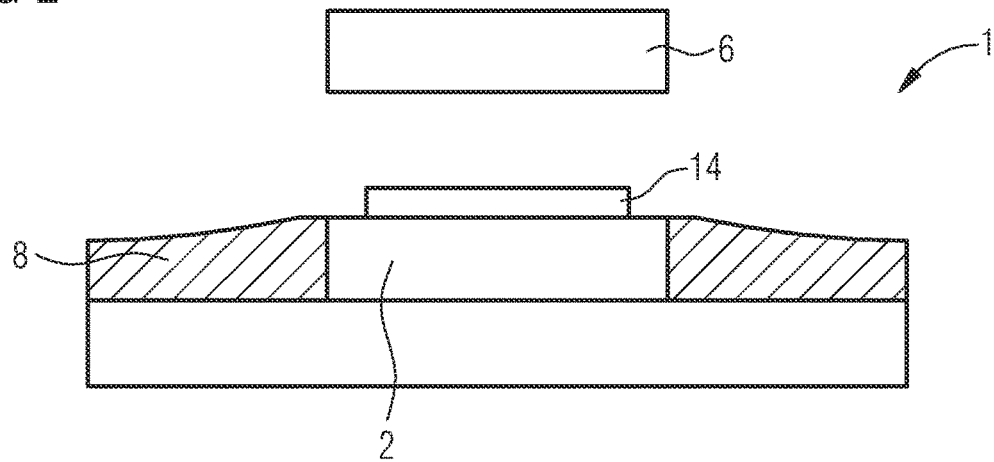
FIGS. 2 and 3 show schematic sectional views of production stages of the method for producing an optoelectronic component according to an exemplary embodiment.
Figure 3:
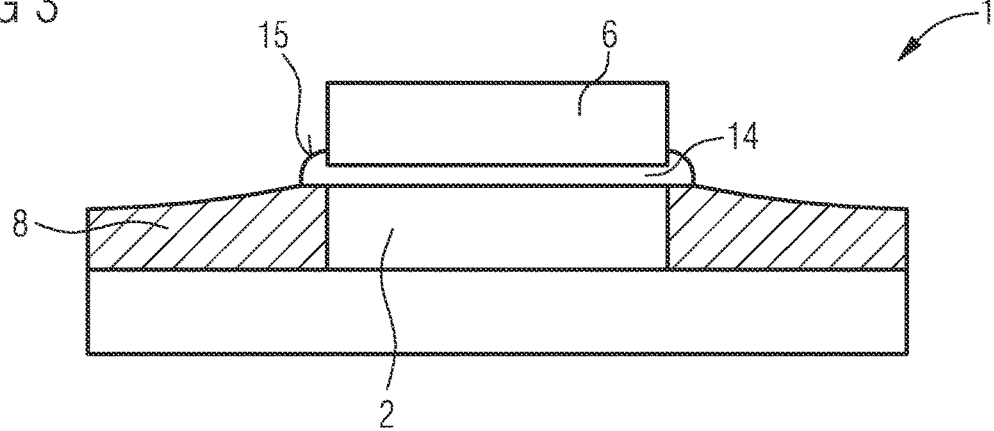

In connection with the exemplary embodiment of FIGS. 2 and 3, production stages in the production of an optoelectronic component 1 are illustrated.

As shown in FIG. 2, the conversion element 6 and the radiation emitting semiconductor chip 2 are provided separately. A material of the adhesion promoter 14 is already applied to the radiation incident surface 2 of the radiation emitting semiconductor chip 2 in the form of a droplet as shown in FIG. 2. The material of the adhesion promoter 14 is present in a flowable form when applied.

In a next process step, the conversion element 6 is applied to the adhesion promoter 10, as shown in FIG. 3. The conversion element 6 is dipped centrally into the material of the adhesion promoter 14 with a bottom surface first and is preferably pressed against the radiation emitting semiconductor chip 2 with a constant pressure.

The adhesion promoter 10 is thus partially displaced by the conversion element 6 and is deposited on the top surface of the first potting 9 in the region around the conversion element 10. In addition, the displaced adhesion promoter 10 is deposited on the side surface of the conversion element 7.

In this case, the top surface of the first potting element 9 is not treated by means of a plasma treatment after application. Thus, the top surface of the first potting 9 generally has a comparatively low wettability for the adhesion promoter 10. As a result, the liquid material of the adhesion promoter 14 is only displaced into the region around the conversion element 6 onto the top surface of the first potting 9 and onto the side surface of the conversion element 7.

After the conversion element 6 has been applied to the semiconductor chip 2, the material of the adhesion promoter 14 to the adhesion promoter 10 is cured, for example, by means of UV irradiation.

Figure 4:
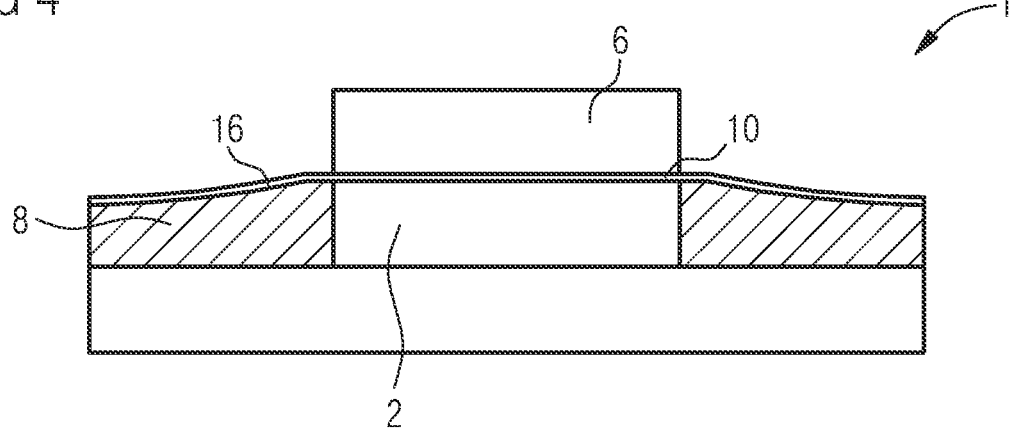
FIGS. 4 and 5 each show schematic a sectional view of an optoelectronic component according to an exemplary embodiment.

In contrast to the optoelectronic component 1 according to the exemplary embodiment of FIG. 4, the optoelectronic component 1 according to the exemplary embodiment of FIG. 1 does not have a second potting 12. Furthermore, the adhesion promoter 10 is formed as a thin layer 16. Since the top surface of the first potting is here wettable by the adhesion promoter, the top surface of the first potting 9 is in this case completely covered by the adhesion promoter 10 in the form of a thin layer 16.

The thin layer 16 has a thickness of at most 5 micrometres. Further, the thickness of the thin layer 16 tapers away from the conversion element 6.

A cross-section perpendicular to the lateral direction of the thin layer 16 is so small that light conduction of primary radiation and secondary radiation is advantageously suppressed.

Figure 5:
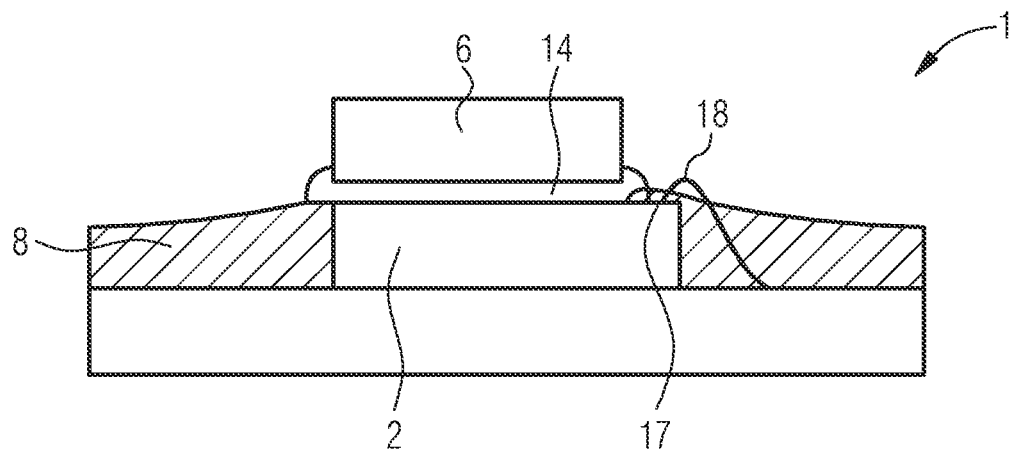

In contrast to the optoelectronic component 1 according to the exemplary embodiment of FIG. 5, the optoelectronic component 1 according to the exemplary embodiment of FIG. 1 also has no second potting. Furthermore, the top surface of the semiconductor chip 4 has an electrical contact 17. The electrical contact 17 can be electrically contacted by means of a bonding wire 18. In this case, an edge portion of the top surface of the semiconductor chip 4 in the region of the electrical contact 17 on the top surface of the semiconductor chip 4 is not part of the radiation emitting surface 3.

Between the adhesion promoter 10 and the electrical contact 17, the first potting 8 is arranged. Thus, a direct light conduction of primary radiation and/or secondary radiation through the adhesion promoter 10 to the electrical contact 17 is advantageously suppressed. Primary radiation and/or secondary radiation are thus not absorbed by the electrical contact 17, but reflected by the first potting 8. In this way, an increased light extraction and efficiency can be achieved.

In other words, the first potting 8 covers the electrical contact 17. The first potting 8 thereby protrudes beyond the top surface of the semiconductor chip 4 in the vertical direction in the region of the electrical contact 4. Furthermore, the first potting 8 partially covers the bonding wire 18.

The invention is not limited to the exemplary embodiments by the description based thereon. Rather, the invention encompasses any new feature as well as any combination of features, which in particular includes any combination of features in the claims, even if this feature or combination itself is not explicitly specified in the claims or exemplary embodiments.

The invention claimed is:

1. An optoelectronic component comprising:
    a radiation emitting semiconductor chip configured to emit primary electromagnetic radiation from a radiation emission surface;
    a conversion element configured to convert the primary electromagnetic radiation into electromagnetic secondary radiation;
    a first potting covering at least one side surface of the semiconductor chip;
    a second potting arranged on the first potting; and
    an adhesion promoter with which the conversion element is fixed on the radiation emission surface of the semiconductor chip,
    wherein the adhesion promoter is arranged on a top surface of the first potting,
    wherein the first potting comprises first filler particles,
    wherein the second potting comprises second filler particles, and
    wherein a mass fraction of the first filler particles is greater than a mass fraction of the second filler particles per volume element.

2. The optoelectronic component according to claim 1, wherein the second potting covers at least one side surface of the conversion element.

3. The optoelectronic component according to claim 1, wherein the first potting completely covers at least the side surface of the semiconductor chip.

4. The optoelectronic component according to claim 1,
    wherein the adhesion promoter covers the top surface of the first potting and the side surface of the conversion element in places, and
    wherein an outer surface of the adhesion promoter has a convex, concave or triangular shape in cross-section.

5. The optoelectronic component according to claim 1, wherein the adhesion promoter is a thin layer.

6. The optoelectronic component according to claim 1, wherein the first filler particles are diffusely reflective for the primary electromagnetic radiation and/or the secondary electromagnetic radiation.

7. The optoelectronic component according to claim 1, wherein the second filler particles are diffusely reflective for the primary electromagnetic radiation and/or the secondary electromagnetic radiation.

8. The optoelectronic component according to claim 1, wherein the first filler particles and/or the second filler particles comprise $TiO_2$ particles.

9. The optoelectronic component according to claim 1, wherein the first potting has a higher reflectivity for the primary electromagnetic radiation and/or the secondary electromagnetic radiation than the second potting.

10. The optoelectronic component according to claim 1, wherein the conversion element comprises a ceramic material.

11. The optoelectronic component according to claim 1, wherein the adhesion promoter is an adhesive.

12. A lighting device comprising:
    at least one optoelectronic component according to claim 1.

13. The lighting device according to claim 12, wherein the lighting device is a spotlight.

14. A method for producing an optoelectronic component, the method comprising:
    providing a radiation emitting semiconductor chip for emitting primary electromagnetic radiation from a radiation emitting surface;
    applying a first potting so that the first potting covers at least one side surface of the semiconductor chip;
    applying a second potting on the first potting,
    providing a conversion element for converting the primary electromagnetic radiation into secondary electromagnetic radiation;
    applying a material of an adhesion promoter to the radiation emitting surface of the semiconductor chip; and
    applying the conversion element to the material of the adhesion promoter,
    wherein the material of the adhesion promoter is partially displaced by the conversion element and is arranged on a top surface of the first potting,
    wherein the first potting comprises first filler particles,
    wherein the second potting comprises second filler particles, and
    wherein a mass fraction of the first filler particles is greater than a mass fraction of the second filler particles per volume element.

15. The method according to claim 14, wherein the material of the adhesion promoter is applied in flowable form and subsequently cured to form the adhesion promoter.

16. The method according to claim 15, wherein the material of the adhesion promoter wets the top surface of the first potting in places.

17. The method according to claim 14, wherein the material of the adhesion promoter completely wets the top surface of the first potting.

* * * * *